United States Patent [19]

Shimkunas

[11] Patent Number: 4,668,336

[45] Date of Patent: May 26, 1987

[54] PROCESS FOR MAKING A MASK USED IN X-RAY PHOTOLITHOGRAPHY

[75] Inventor: Alexander R. Shimkunas, Palo Alto, Calif.

[73] Assignee: Micronix Corporation, Los Gatos, Calif.

[21] Appl. No.: 867,109

[22] Filed: May 23, 1986

Related U.S. Application Data

[62] Division of Ser. No. 758,596, Jul. 23, 1985, Pat. No. 4,608,268.

[51] Int. Cl.[4] .................. B44C 1/22; C03C 15/00; H01L 21/306; C23F 1/02
[52] U.S. Cl. .................... 156/643; 156/646; 156/652; 156/655; 156/656; 156/659.1; 204/192.32; 378/35; 430/5; 430/317; 430/318
[58] Field of Search ............ 378/35; 430/5, 313, 430/317, 318; 204/192 EC, 192 E; 156/626, 627, 643, 646, 652, 655, 656, 659.1; 427/160, 8

[56] References Cited

U.S. PATENT DOCUMENTS 3,743,842 7/1973 Smith et al. .................... 430/5 X R
3,975,252 8/1976 Fraser et al. .................... 204/192 R
4,037,111 7/1977 Coquin et al. .................. 430/5 X R
4,171,489 10/1979 Adams et al. .................... 378/35
4,515,876 5/1985 Yoshihara et al. ............... 430/5

Primary Examiner—William A. Powell
Attorney, Agent, or Firm—Kenneth E. Leeds; Alan H. MacPherson; Steven F. Caserza

[57] ABSTRACT

A method of manufacturing a mask for use in x-ray photolithography includes the steps of coating a set of wafers (20) with boron nitride (22). The tension in the boron nitride is measured by using a capacitive probe (26) to measure bowing in a set of test wafers. The remaining wafers are attached to a pyrex ring (28), and the boron nitride is removed from one side of the wafers. A circular hole is then etched in the wafer, and a layer of tantalum (32) and gold (34) are formed on the remaining boron nitride membrane. The gold (34) is patterned via a sputter etching process. Power is reduced at the end of the sputter etching process slowly to reduce mechanical stress in the mask. The tantalum (32) is then etched via a reactive ion etching process. In this way, an x-ray transparent boron nitride membrane is used to support x-ray opaque gold.

7 Claims, 16 Drawing Figures

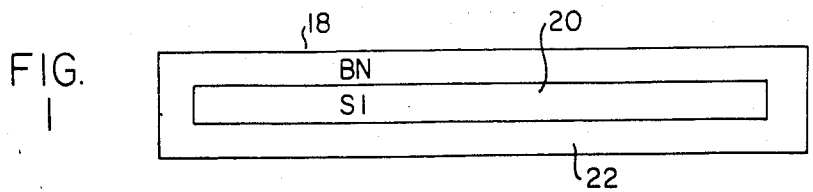
FIG. 1
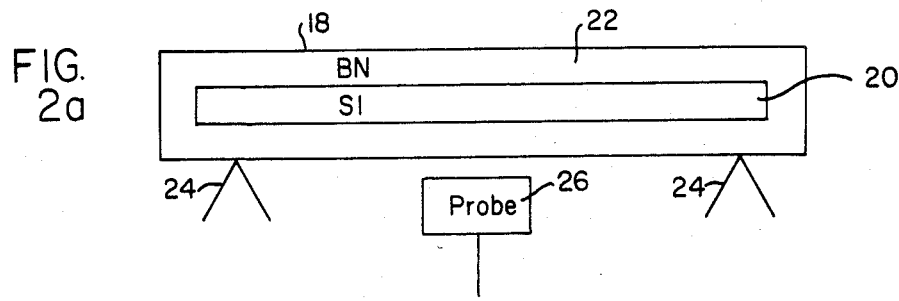
FIG. 2a
FIG. 2b
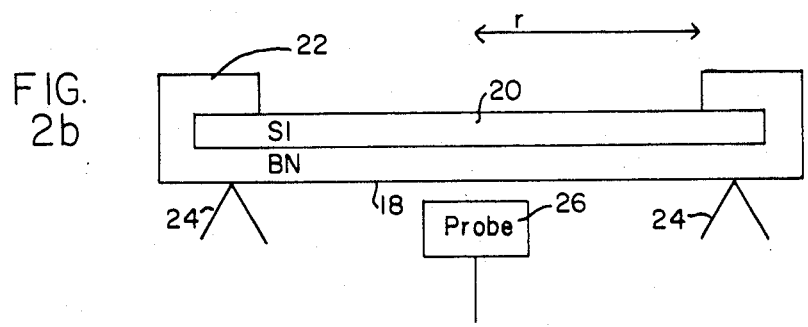
FIG. 3
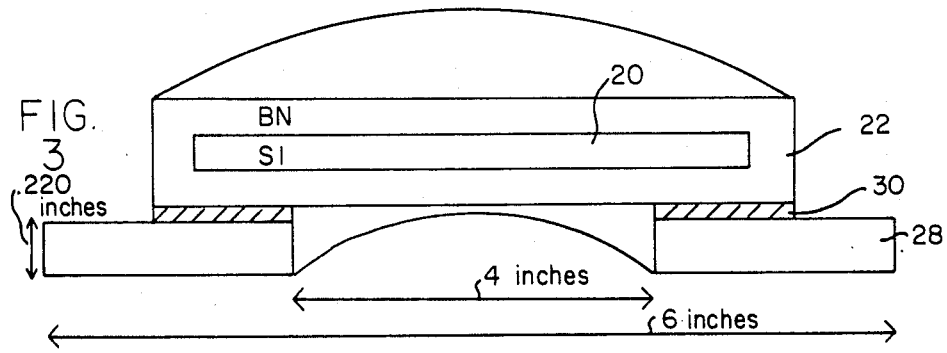
FIG. 4
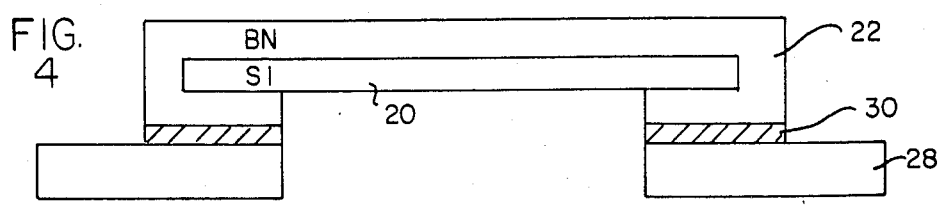
FIG. 5

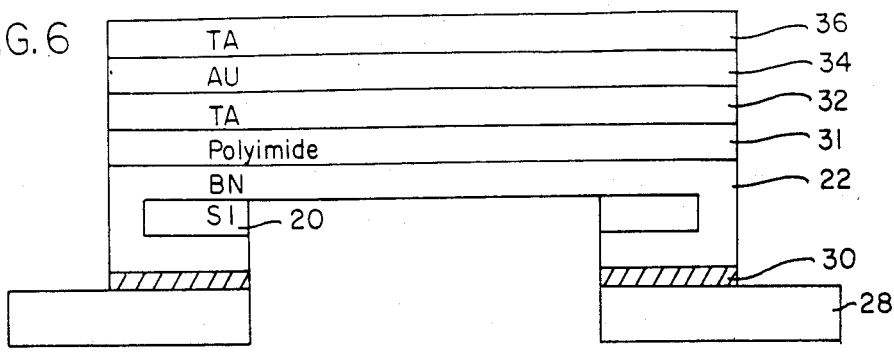
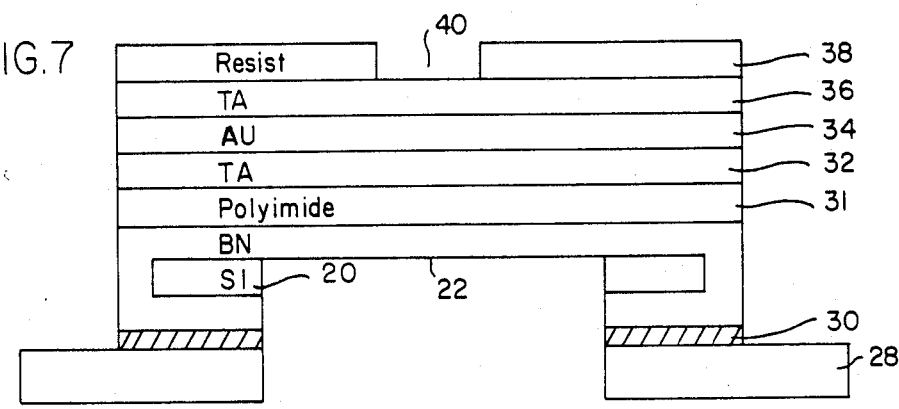
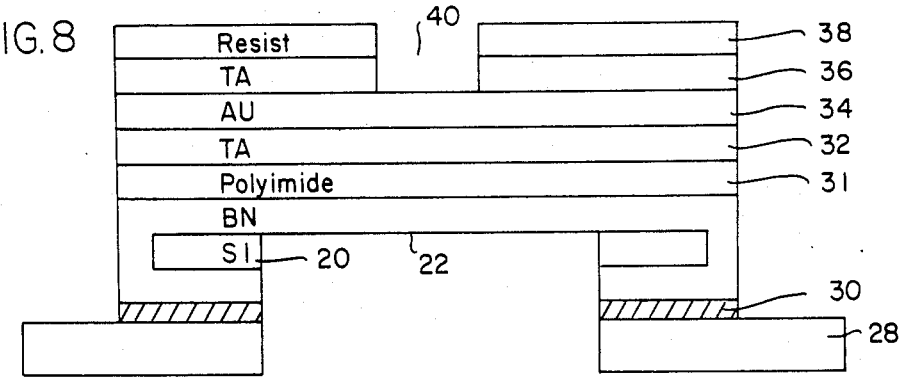
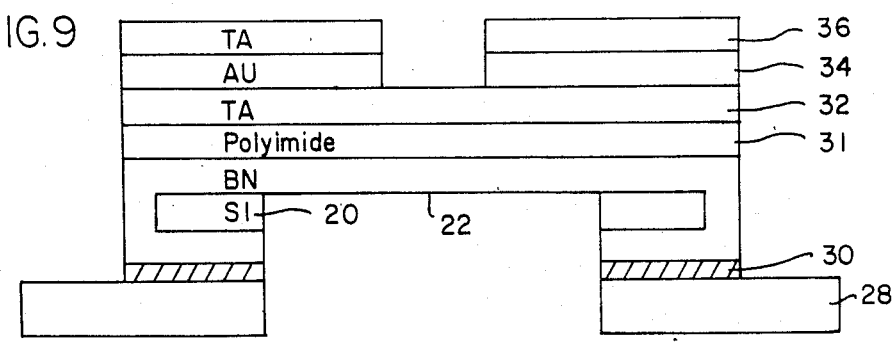

PROCESS FOR MAKING A MASK USED IN X-RAY PHOTOLITHOGRAPHY

This application is a division of application Ser. No. 758,596 filed July 23, 1985 now U.S. Pat. No. 4608268.

BACKGROUND OF THE INVENTION

1. Field of the Invention

This invention relates to masks used in x-ray photolithography, and more specifically, to methods for manufacturing such masks.

2. Description of the Prior Art

It is known in the art to manufacture integrated circuits using photolithographic processes. In such a process, a silicon wafer is covered with a layer of photoresist. The layer of photoresist is selectively exposed to light and thereafter developed. The exposed portions of photoresist are then removed, thus exposing portions of the silicon wafer. The exposed portions of silicon are then subjected to any of a number of processing steps, e.g., a layer of silicon dioxide can be grown on them, or the exposed regions can be doped with impurities, thus giving the silicon wafer desired electrical properties. It is known in the art to selectively expose portions of the photoresist by using a mask. Typical photolithographic processes use light in the visible spectrum to expose the photoresist. It is known in the art, however, that one can obtain finer resolution by using radiation having a wavelength shorter than the light of the visible spectrum. For example, U.S. Pat. No. 3,743,842 issued to Smith, et al., discusses photolithographic processes using radiation in the soft x-ray region of the spectrum.

Masks for use in x-ray photolithography ideally include an x-ray transparent film affixed to a holding ring. On top of the transparent film is a patterned x-ray absorbing layer. The x-ray absorbing layer typically includes a layer of gold. Examples of x-ray photolithography masks are discussed in U.S. Pat. No. 4,171,489, entitled "Radiation Mask Structure" and U.S. Pat. No. 4,037,111, entitled "Mask Structures for X-Ray Lithography".

SUMMARY

In accordance with the present invention, a method is provided for manufacturing a mask for use in x-ray photolithographic processes. A batch of silicon wafers are coated with a layer of boron nitride. At least one wafer from the batch is used as a test wafer to monitor processing parameters. In accordance with one novel feature of the present invention, the test wafer is placed on a set of point supports in proximity to a capacitive probe which is used to measure the distance from the probe to the test wafer. Then, the boron nitride on one side of the test wafer is removed and the distance measurement is repeated. Because of the stress placed on the test wafer by the layer of boron nitride (which can be either compressive or tensile), the test wafer bows. The stress placed on the test wafer by the layer of boron nitride can be determined by measuring the relative displacement of the test wafer from the capacitive probe before and after the boron nitride is etched from one side of the wafer. In this way, it can be determined from the test wafer what sort of annealing should be performed on the boron nitride on the remaining wafers. (Annealing is performed by heating the boron nitride, which causes a more tensile stress in the boron nitride. Tension increases as a function of annealing time.) The boron nitride on the remaining wafers is then annealed and the wafers are affixed to a pyrex ring using an epoxy adhesive.

Thereafter, the boron nitride on one surface of the wafers affixed to the pyrex ring is removed to leave a pyrex ring affixed to a layer of boron nitride and silicon with the pyrex ring sealed to the silicon via an annular ring of boron nitride. Then, the mask is subjected to a silicon etch to remove a circular portion of the silicon wafer. After the silicon etch, the mask consists of a boron nitride membrane affixed to a silicon ring which is affixed to a pyrex ring. The boron nitride membrane is then covered with a layer of polyimide in order to add mechanical strength to the membrane. This is done by spinning a polyimide precursor on the membrane and curing the precursor. In order to prevent gaps in the precursor caused by surface tension effects, the precursor in the central portion of the membrane is heated during the spinning process. The layer of polyimide is then covered with a first layer of tantalum, a layer of gold, a second layer of tantalum, and a layer of photoresist. The first layer of tantalum serves as an adhesive layer between the polyimide and gold layers as well as an etch stop.

The layer of photoresist is patterned, e.g., by masking and exposing to light, or using an E-beam direct write technique and removing desired portions of the photoresist thus exposing portions of the second layer of tantalum. The exposed portions of the second tantalum layer are then removed via a reactive ion etching (RIE) process thus exposing portions of the layer of gold. The exposed portions of gold are then removed (thus exposing portions of the first tantalum layer) via a sputter etching process, as is the remaining portion of the photoresist. The mask is then subjected to another RIE process during which the remaining portions of the second layer of tantalum and the exposed portions of the first layer of tantalum are removed. In this way, a mask is provided having a patterned layer of gold (which is x-ray opaque) formed on a boron nitride membrane (which is x-ray transparent).

In accordance with one novel feature of the present invention, at the end of the above-mentioned sputter etching process, power is reduced in the sputter etching chamber slowly. This is because during sputter etching the mask heats up. As it cools, the center of the boron nitride membrane cools first, followed by the portions of the mask adjacent the pyrex ring. Because of this, the central portions of the mask contract relative to the periphery of the mask, subjecting the center of the mask to mechanical stress. By cooling the mask slowly, the center of the mask is subjected to less mechanical stress, and is therefore less likely to be damaged during this process.

BRIEF DESCRIPTION OF THE DRAWING

FIGS. 1 through 10 are illustrations in cross section of an x-ray mask during stages of fabrication.

DETAILED DESCRIPTION

Figure 10:
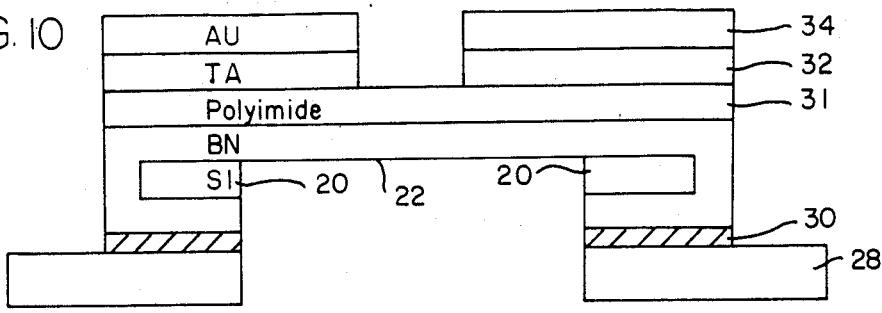

The process of the present invention includes the step of depositing a layer of boron nitride on each side of each wafer in a batch of wafers resting in a selected support structure (typically a quartz boat) during the deposition process. Typically, each wafer comprises silicon. Hereinafter, the term "wafer" is used to mean not only this silicon but also the other material deposited directly or indirectly on the silicon. After deposition, each boron nitride layer possesses a certain tension. As an important part of the process, the tension in each boron nitride layer is measured after deposition by placing one of the wafers designated as a test wafer in proximity to a capacitive probe and determining the distance between the wafer and the probe as a function of an output signal from the capacitive probe. The boron nitride on one side of the test wafer is then removed. As this boron nitride is removed, the test wafer bows due to the tension in the boron nitride layer remaining on the other side of the wafer. The test wafer is then placed in proximity to the probe to measure the bowing in the wafer caused by the tension in the remaining layer of boron nitride on the test wafer. Because the boron nitride on the test wafer and the boron nitride on the remaining wafers are deposited during the same process, the tension in the boron nitride on the test wafer and remaining wafers is approximately equal. Thus, by measuring the tension in the boron nitride layer on the test wafer, the tension in each boron nitride layer on the remaining wafers is also determined. The wafers (including the test wafer) are then annealed to increase the tensile stress in each boron nitride layer on each wafer. The tension measured in the boron nitride on the test wafer is used to select the annealing time for the remaining wafers in the batch of wafers. The lesser the tensile stress in the boron nitride layer on the test wafer, the longer the required annealing time to increase the tensile stress to the desired level. In addition, after annealing, the tension in the boron nitride layer on the test wafer is measured again using the capacitive probe to determine if additional annealing is required.

Each of the wafers is then affixed to a pyrex ring and the boron nitride on one side of each wafer is removed, exposing a circular portion of the underlying silicon. The exposed silicon of each wafer is then etched away. After the selected circular portion of silicon is etched away on each wafer, each wafer then comprises a pyrex ring bonded to a silicon ring covered by a boron nitride membrane under tension.

The boron nitride membrane is then covered with a layer of supporting material such as polyimide. This is done by spinning a material, which when cured becomes a polyimide, on the boron nitride membrane. This material is called a "polyimide precursor." The center portion of the precursor is heated during the spinning on of this material to prevent the precursor surface tension from causing gaps at the edges.

The polyimide precursor is cured by heating to form polyimide, and a layer of a material (typically tantalum) which bonds to both gold (a material opaque to x-rays) and polyimide is deposited on the wafer. Gold is next deposited and the gold is patterned by selective removal typically using a sputter etching process. Following the removal of the gold, the temperature of each wafer is reduced slowly in order to limit the temperature difference between the center of the boron nitride membrane and the membrane periphery. This is done to limit mechanical stress on the boron nitride membrane of each wafer. This process provides a mask which includes a boron nitride membrane under a desired tension which supports a patterned layer of gold.

Figure 14:
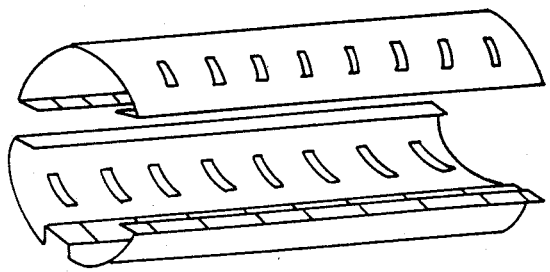
FIG. 14 is an illustration of a quartz boat used in the present invention.

In accordance with the process of the present invention, a lightly doped or undoped silicon wafer 18 is coated with a layer of boron nitride 22 as illustrated in FIG. 1. In one embodiment, the layer of boron nitride is typically 3 to 5$\mu$ thick and silicon substrate 20 is typically 625 microns thick plus or minus 25 microns. Silicon substrate 20 is typically 125 millimeters in diameter (4.94 inches) but other diameters are also capable of being used with this invention. Hereinafter, the parameters provided in parenthesis are those used in one embodiment of the invention. In one embodiment, boron nitride layer 22 is deposited on silicon substrate 20 using a low pressure chemical vapor deposition (LPCVD) process. This process takes place at about 340° C. and uses $NH_3$ flowing at 25 to 30 SCCM, $B_2H_6$ flowing at 60 to 70 SCCM, and $N_2$ flowing at 540 to 600 SCCM. (Instead of using $N_2$, one can also use helium.) When coating wafers with boron nitride, the wafers rest in a quartz boat (illustrated in FIG. 14) which rests in a quartz tube under vacuum. After several runs, the quartz boat becomes coated with boron nitride and must be cleaned regularly. If the quartz boat is not cleaned regularly, boron nitride particles fall off the boat and lodge on the wafers, causing pin holes in the boron nitride membranes subsequently formed. Pin holes are a fatal defect in x-ray photolithographic masks. Applicant has found that by using a sodium hypochlorite solution, the boron nitride on the quartz boat can be cleaned off. In one embodiment, the quartz boats are cleaned by soaking the quartz boats in a solution at about 35° C. of 12.5 to 14.5% sodium hypochlorite and the remainder water or inert solution. In addition, parts of the LPCVD apparatus, e.g., the manifolds, can be cleaned in the sodium hypochlorite solution.

After a batch of silicon wafers is coated with boron nitride as illustrated in FIG. 1, a capacitive stress test is performed on a set of test wafers (for example, three test wafers per lot). This is done to measure the stress on the silicon wafer caused by layer of boron nitride 22. Referring to FIG. 2a, test wafer 18 is placed on a set of three point supports 24 two of the supports being illustrated. (In another embodiment, test wafer 18 is placed on a set of knife edge supports.) A capacitive probe 26 is placed in proximity to wafer 18 and the capacitive effect of wafer 18 on capacitive probe 26 is measured.

In one embodiment of the invention, the capacitive probe is a type such as model number CB-5, manufactured by Lion Precision Corporation of Newton, Massachusetts, including modules MPM-1 and DMJ-1M and provides a reading in units of distance rather than farads. The capacitive probe is placed a predetermined distance (760$\mu$) from the wafer. (In the prior art, bowing was measured by laser interferometry.) Then, the boron nitride on one side of test wafer 18 is removed. In one embodiment, this is done in a barrel plasma etch process using an 84% $CH_4$ 16% $O_2$ plasma at 500 mTorr of pressure and 200 watts. The distance measurement is then repeated as is illustrated in FIG. 2b. Because of the stress on test wafer 18 caused by layer of boron nitride 22, test wafer 18 bows. Because of this, wafer 18 will either move closer to probe 26 or further from probe 26 depending upon whether the stress is tensile or compressive. Specifically, facing boron nitride layer 22, if the stress on layer 22 is compressive, wafer 18 is concave, whereas if the stress is tensile, wafer 18 is convex. This bowing is measured by capacitive probe 26. The tensile stress is related to bowing distance by the following equation:

$$\sigma_R = \frac{1}{3}\left(\frac{E_s}{1-v_s}\right)\left(\frac{t_s}{r}\right)^2\left(\frac{\Delta d}{t_f}\right), \text{ where}$$

$\sigma_R$ = residual stress;
$E_s$ = Young's modulus of substrate 20;
$v_s$ = Poisson's ratio of substrate 20;
$t_s$ = thickness of substrate 20;
r = radius of wafer 18 measured from the center of wafer 18 to the edge of the boron nitride as indicated in FIG. 2b;
$\Delta d$ = net deflection at center of wafer 18;
$t_f$ = thickness of boron nitride layer 22.

If the stress on the boron nitride is tensile and is less than a desired stress ($6 \times 10^8$ dynes per centimeter squared) or if the stress is compressive, then the batch of wafers is annealed until the stress becomes tensile within a desired range ($6 \times 10^8$ and $10 \times 10^8$ dynes per centimeter squared). Annealing is a process by which the boron nitride is heated, causing the stress in the boron nitride to become more tensile. In one embodiment, annealing is performed at a temperature about 40° C. greater than the boron nitride deposition temperature. Thus if boron nitride 22 is deposited at 340° C., it is annealed at 380° C. in a nitrogen atmosphere for as long as required to achieve the above results. During the annealing process, the test wafers are annealed along with the rest of the wafers. Bowing measurements are then repeated on the test wafers as described above to ensure proper tension in boron nitride layer 22.

Maintaining tensile stress in layer 22 is necessary because during a subsequent step, described below, part of silicon substrate 20 is etched away, leaving a window region across which layer of boron nitride 22 is stretched. Layer 22 forms a support for a subsequently deposited x-ray opaque layer which must not be permitted to move with respect to the rest of the mask. By maintaining layer 22 under a proper tensile stress, boron nitride layer 22 is unable to move.

Figure 11:
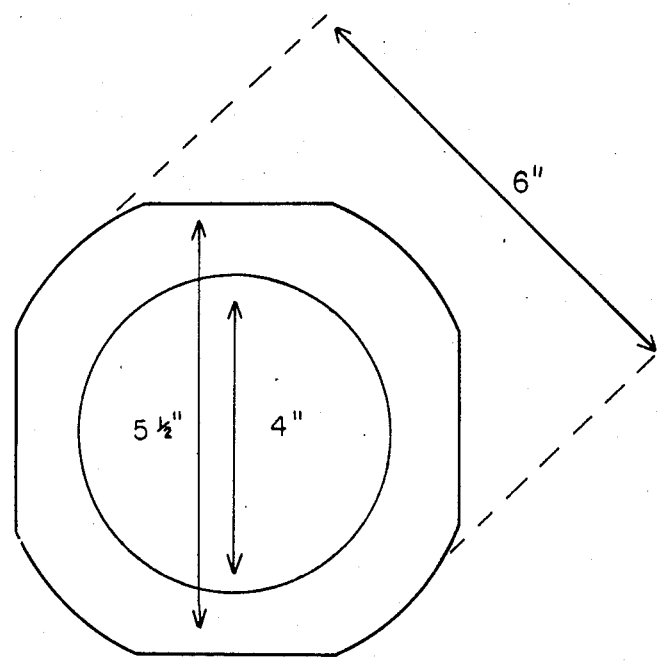
FIG. 11 is an illustration of a pyrex ring used to manufacture an x-ray mask.

After the wafers are annealed, the remaining wafers are bonded to pyrex rings, such as pyrex ring 28, as illustrated in FIG. 3. In one embodiment, ring 28 is of a type such as model number 7740, available from Corning having an inner diameter of about four inches and an outer diameter of six inches. In one embodiment, pyrex ring 28 has an interior, illustrated in FIG. 11, that has four flats with a distance of 5½ inches from flat to flat and a thickness of 0.220 inches. In a preferred embodiment of the invention, pyrex ring 28 is bonded to the boron nitride coated wafer 18 via an epoxy adhesive 30, as illustrated in FIG. 3. Epoxy adhesive 30 is of a type such as model no. 353ND manufactued by Epoxy Technology Inc. This epoxy is capable of withstanding a subsequent KOH etch.

Referring to FIG. 4, the boron nitride on one side of wafer 18 is then removed. In one embodiment, this is done by a barrel plasma etch, using an 84% CH₄- 16% O₂ plasma at 500 mTorr and 200 watts. The boron nitride layer on the other side of wafer 18 is typically protected by a thick photoresist back lap such as Kodak surface protective resin model number 650/MX936 or by a mechanical aluminum masking fixture.

As illustrated in FIG. 5, the next step in the process is to remove the silicon except for that portion of the silicon directly above the pyrex ring 28. This is typically done using a KOH etch. In one embodiment of the invention, a surfactant such as model no FC-129 manufactured by 3M is mixed in with the KOH etch in order to avoid a concentration of bubbles near the silicon surface. This permits fresh KOH etchant to attack the silicon being removed.

In one embodiment of the invention, 3 parts deionized (DI) water to 1 part of a 45% KOH solution are mixed to fill an 8¼" high by 8¼" diameter container and 10 drops of FC-129 are added. The solution is heated to about 95° C., and is used to etch the wafers. The etching process takes about 5 to 6 hours.

Figure 15:
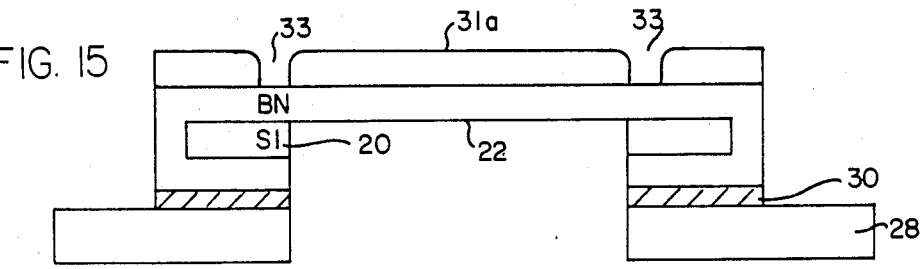
FIG. 15 is an illustration of a boron nitride membrane covered with a polyimide precursor.

Boron nitride membrane 22 is then rinsed in hot (approximately 70° C.) DI water and then dried. Then, membrane 22 is coated with a polyimide layer 31, (approximately $2\mu$ thick) e.g., by spinning on a polyimide precursor such as Pyralin model PI-2555 available from Dupont and then curing the precursor. This is done to add mechanical strength to membrane 22. It has been discovered that surface tension in the polyimide precursor can cause the precursor at the periphery of the membrane to be pulled toward the center, thus causing gaps 33 in a precursor layer 31a (FIG. 15). To prevent this, while the precursor is being spun on membrane 22, the central portion of the mask is heated. This increases the precursor viscosity near the center of membrane 22 and therefore the abovementioned surface tension effect, thereby reducing the likelihood of forming gaps 33. In one embodiment, the heating is done by holding a heat lamp about 2 inches from the center of membrane 22 while spinning on the precursor. After that, the polyimide precursor is cured. The heat lamp uses a 375 watt infrared bulb and is of a type such as model number 15085 available from Bel-Art Products of Pequannock, New Jersey.

The polyimide layer can be placed on the top side of membrane 22 (as in FIG. 6) or on the bottom side of the membrane. (In an alternative embodiment, polyimide layer 31 is not used at all.) The remaining discussion refers to an embodiment in which polyimide layer 31 is placed on the top side of the membrane, although the steps hereinafter described are applicable to the abovementioned alternative embodiments.

Referring to FIG. 6, polyimide layer 31 is then coated with a first tantalum layer 32 (300 Å thick), a gold layer 34 (6000 Å thick), and a second tantalum layer 36 (600 to 900Å thick). Layers 32, 34, and 36 are deposited on polyimide layer 31 using a sputtering process. First tantalum layer 32 is an adhesion layer for binding layer of gold 34 to layer of polyimide 31 and serves as an etch stop for patterning gold. Referring to FIG. 7, layer of tantalum 36 is then covered with a layer of photoresist 38 which is selectively exposed. The regions of photoresist layer 38 which are selectively exposed are then removed, thus forming openings (e.g., opening 40 in photoresist layer 38). As illustrated in FIG. 8, the portion of tantalum layer 36 underneath opening 40 is then removed. In one embodiment of the invention, the portion of tantalum layer 36 underneath opening 40 is removed via a reactive ion etching (RIE) process. The layer of tantalum is etched anisotropically using carbon tetrafluoride as the process gas at 15 mTorr, with layer of gold 34 serving as an etch stop during this step. 125 watts of power are used in this process, delivering a power density of 0.17 watts/cm². This process is described in "Advances in X-Ray Mask Technology," by the inventor of the present invention, published in the September 1984 issue of "Solid State Technology". FIG. 8 illustrates the mask after this step.

Figure 13:
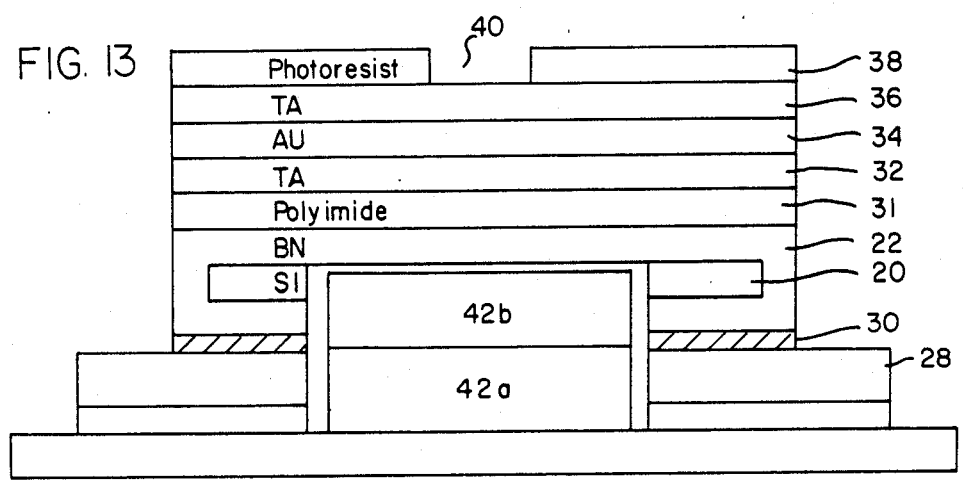
FIG. 13 is an illustration in cross section of a mask in a reactive ion etching chamber during the manufacturing process of the present invention.

It has been found that during the reactive ion etching process, the mask heats up enough to cause boron nitride membrane 22 to sag initially. To provide better heat transfer during the RIE and sputter etching processes, in one embodiment, two Silvercon disks 41a and 42b are placed in the cavity side of the mask and the mask is raised so that the Silvercon top disk just touches membrane 22 as illustrated in FIG. 13. (The Silvercon disks, manufactured by Elastomerics, are each 0.125 inches thick and are made of a silver-impregnated silicone rubber.) The lower disk rests on a water-cooled cathode.

As illustrated in FIG. 9, the portion of layer of gold 34 underneath region 40 is then removed using a sputter etch. During this process, layer of photoresist 38 is also removed. The process of sputter-etching gold can be accomplished in a manner similar to that disclosed in U.S. Pat. No. 3,975,252, issued to Fraser, et al., on Aug. 17, 1976, entitled "High Resolution Sputter Etching," or in the "Advances in X-Ray Mask Technology" article. Sputter etching of gold is typically done in a 10% oxygen 90% argon atmosphere at 10 mTorr in the same chamber at the RIE process. This process uses about 300 watts of power, or a density of 0.41 watts/cm².

Figure 12:
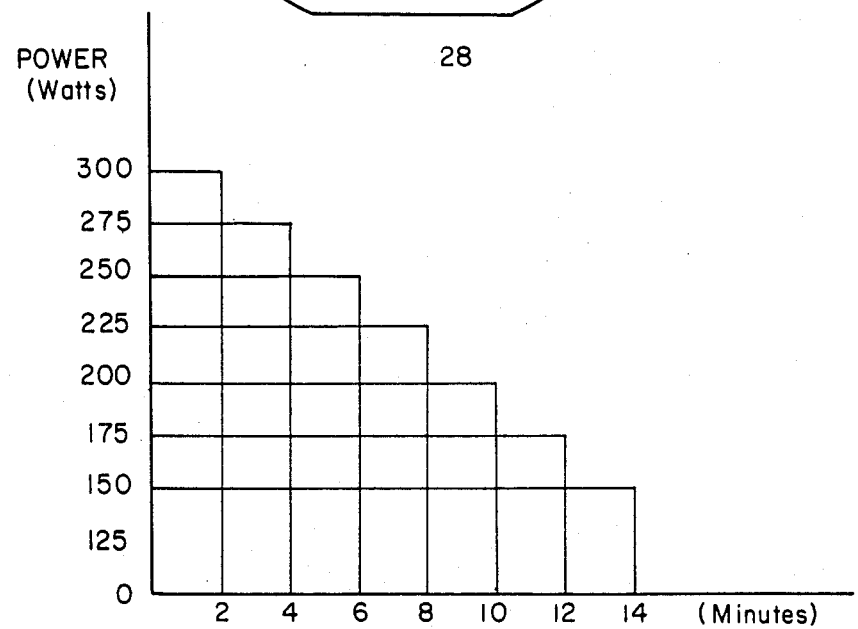
FIG. 12 is a graph of power delivered to etching apparatus versus time at the end of a gold sputter etching process used in the process of the present invention.

During sputter etching, it has been found that the mask heats up. When sputter etching ceases, and the mask cools, the portion of the boron nitride film in the center of the mask cools (and therefore contracts) before the rest of the mask. This causes additional mechanical stress in layer of boron nitride 22, and can cause it to break. This stress can be mitigated by cooling the mask slowly after sputter etching. In accordance with one novel feature of the invention, this is done by reducing power to the sputter etching chamber slowly. A graph of power versus time during this part of the process is provided in FIG. 12. Accordingly, the temperature difference between the boron nitride in the middle of the mask and the rest of the mask is limited, the mechanical stress on layer 22 is limited, and the mask is less susceptible to damage during this process.

Referring to FIG. 10, the remaining structure is then subjected to a tantalum etch which removes layer of tantalum 36 and that portion of tantalum layer 32 underneath the previously etched layer of gold 34. Typically, this is accomplished with a reactive ion etch process as described above.

After the exposed portion of layer 32 is etched, the remaining structure is then covered with a layer of polymer (5000 Å thick) to protect the gold and prevent Auger or photoelectrons from the gold from exposing resist when the mask is used to manufacture integrated circuits. This polymer can be either polyimide, a photoresist such as AZ-1450J, or PMMA.

A mask manufactured in the above-described process is typically used with x-rays having a wave length of 4.3 Å. To generate these x-rays, a palladium target is bombarded with high energy electrons. The mask is used in the manufacturing of integrated circuits in a semiconductor wafer. Specifically, one typically provides a semiconductor wafer upon which integrated circuits are to be formed and coats the semiconductor wafer with a layer of photoresist sensitive to x-ray radiation. X-rays are directed toward the mask and pass through the x-ray transparent portions of the mask but are blocked by the x-ray opaque portions of the mask. The x-rays which pass through the x-ray transparent portions of the mask strike the x-ray sensitive photoresist on the semiconductor wafer and expose the photoresist. Thereafter, the photoresist is developed, the exposed portion of the photoresist is removed, and the semiconductor wafer is subjected to subsequent processing, e.g., ion implantation, metallization deposition, etc. (As is known in the art, there are also photoresists in which the exposed portions are retained and the unexposed portions are removed. Such photoresists can also be used with a mask produced by the process of the present invention.)

While the invention has been particularly described with reference to a specific embodiment, those skilled in the art will recognize that minor modifications can be made in the process without departing from the spirit and scope of the invention. Accordingly, all such modifications come within the scope of the invention as delineated by the following claims.

I claim:

1. A method for manufacturing a mask comprising the steps of:
    providing a membrane, said membrane being covered by a layer of a first substance, said layer of said first substance being covered by patterned layer of a second substance;
    transferring the pattern in said patterned layer of said second substance to said layer of said first substance via a sputter etching process, said sputter etching process being performed in an etching apparatus; and
    reducing power to said etching apparatus over a period of time.

2. The method of claim 1 wherein said first substance is tantalum and said second substance is gold.

3. The method of claim 1 wherein said membrane comprises boron nitride.

4. The method of claim 1 wherein said power is reduced over a period of at least 14 minutes.

5. The method of claim 1 wherein said power is reduced from 300 watts to 0 watts in 25 watt increments every two minutes.

6. A method for sputter etching comprising the steps of:
    providing a first layer of a first material having a top surface covered by a second layer of a second material;
    forming a paterned masking layer on said second layer of said second material;
    transferring the pattern in said masking layer to said second layeer by sputter etching; and
    reducing the power used in said sputter etching over a period of time.

7. A method for sputter etching comprising the steps of:
    providing a layer of material;
    sputter etching said layer of material; and
    reducing the power used in said sputter etching over a period of time.

* * * * *